United States Patent [19]

Dixit et al.

[11] Patent Number: 5,225,312
[45] Date of Patent: Jul. 6, 1993

[54] POSITIVE PHOTORESIST CONTAINING DYES

[75] Inventors: Sunit S. Dixit; Richard M. Lazarus, both of Mission Viejo; Thomas P. Carter, Laguna Beach; Joseph E. Oberlander; Andreas Goehring, both of Tustin; Randall W. Kautz, Irvine; Grieg Beltramo, Orange, all of Calif.

[73] Assignee: Morton International, Inc., Chicago, Ill.

[21] Appl. No.: 739,646

[22] Filed: Aug. 2, 1991

Related U.S. Application Data

[63] Continuation-in-part of Ser. No. 557,282, Jul. 24, 1990, abandoned, which is a continuation-in-part of Ser. No. 528,676, May 24, 1990, abandoned.

[51] Int. Cl.$^5$ .......................... G03F 7/023; G03C 1/61
[52] U.S. Cl. ..................................... 430/191; 430/192; 430/512
[58] Field of Search .......................... 430/191, 192, 512

[56] References Cited

U.S. PATENT DOCUMENTS

| | | | |
|---|---|---|---|
| 4,147,552 | 4/1979 | Specht et al. ........................ | 430/195 |
| 4,289,838 | 9/1981 | Rowe et al. .......................... | 430/192 |
| 4,370,405 | 1/1983 | O'Toole et al. ...................... | 430/191 |
| 4,626,492 | 12/1986 | Eilbeck ............................... | 430/191 |
| 4,818,658 | 4/1989 | Martin et al. ........................ | 430/191 |
| 4,882,260 | 11/1989 | Kohara et al. ....................... | 430/191 |
| 4,929,534 | 5/1990 | Stephani et al. .................... | 430/191 |

Primary Examiner—Charles L. Bowers, Jr.
Assistant Examiner—Christopher G. Young
Attorney, Agent, or Firm—Wayne E. Nacker; Gerald K. White

[57] ABSTRACT

A positive photoresist of the type containing an alkali-soluble novolac resin and a quinone diazide sensitizer contains a dye of the general formula:

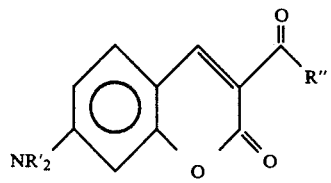

wherein R' is lower alkyl, R" is H, alkyl or $CO_2$-alkyl, alkyl-$CO_2$-alkyl or alkyl-$CO_2$-($C_1$-$C_3$ alkyl-O)$_n$-alkyl (n=1-3) and wherein said dye is compatible with the novolac resin/quinone diazide formulation to at least 0.1 phr. The dye reduces reflective notching. Preferably the photoresist also contain a nitro naphthol dye to reduce the effects of I-Line radiation.

8 Claims, No Drawings

POSITIVE PHOTORESIST CONTAINING DYES

This is a continuation-in-part of U.S. application No. 07/557,282, filed Jul. 24, 1990, which in turn is a continuation-in-part of U.S. application No. 07/528,676, filed May 24, 1990.

The present invention is directed to positive-acting photoresists, particularly those of the type containing an alkali-soluble novolac resin and a quinone diazide compound as a sensitizer. More particularly, the invention is directed to such positive-acting photoresists which contain dyes that reduce reflective notching.

BACKGROUND OF THE INVENTION

Positive-acting photoresists comprising an alkali-soluble novolac resin and a quinone diazide compound as a sensitizer are well known in the art, as is their use in the manufacture of semiconductor devices. Examples of such positive photoresist formulations are found in U.S. Pat. Nos. 3,666,473, 4,115,128, 4,173,470, 4,377,631, 4,529,682, 4,587,196 and 4,731,319. The teachings of each of these patents are incorporated herein by reference.

Above-referenced U.S. Pat. No. 4,731,319 describes a resin containing a mixture of cresol novolac resins and naphthoquinone diazide sulfonic acid ester as the photosensitive component. Above-referenced U.S. Pat. Nos. 4,377,631, 4,587,196 and 4,529,682 are directed to positive-acting photoresists containing cresol-formaldehyde novolac resins and photosensitive naphthoquinone diazide sulfonyl ester.

In positive-acting photoresists of this type, the novolac resin or mixture of resins is soluble in aqueous alkali solution; however, the quinone diazide compound acts to render the novolac resin insoluble in aqueous alkali solution. The azide quinone compounds are photosensitive, and when exposed to actinic radiation are chemically altered and no longer render the novolac resin insoluble. If a layer of photoresist is exposed to patterned actinic radiation, such as actinic radiation passed through a patterned photomask, exposed portions are rendered soluble in alkaline aqueous developer solution, whereas non-exposed portions remain insoluble in alkaline aqueous developer solution. The exposed device is developed in the alkaline aqueous developer solution, removing exposed portions, while leaving non-exposed portions of the photoresist layer on the device.

The present invention is generally applicable to positive photoresists of the alkaline aqueous-soluble novolac resin/quinone diazide formulation type.

It is, of course important that the pattern of the photomask be reproduced on the layer of exposed and developed photoresist as faithfully as possible. This is particularly true as the push toward miniaturization reduces line size and line spacing. The exposed and developed photoresist layer should have clearly defined, vertical sidewalls on the non-exposed portions of the layer which remain after development.

An impediment to excellent resolution is the effects of reflected light during the exposure step. Often the photoresist is applied to a reflective metal surface. The photoresist may be applied to a topographical surface of a semiconductor device, in which case, corners and edges reflect light in unpredictable manners. The problem is especially severe when the surface is both highly reflective and topographical. Resulting lack of reproductive faithfulness due to reflected light is known as reflective notching. The present invention is directed to the novel use of particular dyes to reduce reflective notching.

The use of dyes for reducing reflective notching has been suggested previously. Unfortunately, many of the known dyes for this purpose also reduce the sensitivity of the photoresist to incident light, typically reducing photospeed by about 2 to 3 times. An extremely important aspect in the selection of a dye is its compatibility with the novolac resin/quinone diazide chemical system. Any incompatibility which results in the development of particulates is unacceptable. Generally, it is desirable that the photoresist formulation be stable against the development of particulates for a period of at least a year. A further consideration for selection of a dye for reducing reflective notching is that it absorb strongly in the visible region of the exposing light sources of the scanner and steppers. Typically, the exposing light is mercury vapor emitting a broadband emission in the ultraviolet region which comprises of G line at 436 nm, H line at 405 nm and I line at 365 nm. Generally, a major output wavelength of a scanner is an I line at 365 nm. Typically, a G line dyed resist has no absorbance at I line with the result that the scanner imaged resist has poor sidewall profile. An I line dye and its concentration was selected such that it has absorbance matching a G line in the resist formulation, thereby enhancing the sidewall profile when imaged on the scanners.

The present invention is directed to the use of very specific coumarin dyes used in positive photoresists of the novolac resin/quinone diazide type. Coumarin dyes have been used in photoresists, and even positive photoresists of the novolac resin/quinone/diazide type previously; however, as will be demonstrated hereinafter, the coumarin dyes of the present invention are surprisingly and unexpectedly superior to coumarin dyes previously used in photoresist. A dye should not significantly reduce photospeed. A dye should be compatible with the photoresist system, including solvents and resins. A dye should minimize reflective notching the dyes of the present invention meet all of these qualifications, and, in one respect or another, are substantially better than any of the coumarin dyes previously used. U.S. Pat. No. 4,626,492 to Eibeck suggests the use of several coumarin dyes available from Eastman Kodak; however, Applicants have tested such coumarin dyes and found them to be deficient in one respect or another.

Coumarins, including coumarins of the formula used in the present invention are found in U.S. Pat. No. 4,147,552 to Sprecht et al. However, the coumarins in the issued patent are used not as dyes to reduce reflective notching, but as photosensitizers in a much different type of photoimageable composition, i.e., in a negative-acting photoresist composition in which there is a release of gas during the photoinitiated reaction.

SUMMARY OF THE INVENTION

In accordance with the present invention, to positive photoresists of the novolac resin/quinone diazide type, is added, for the purpose of reducing reflective notching, a dye having the formula:

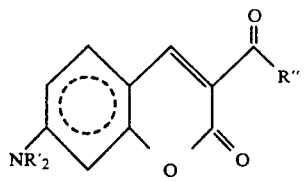

wherein R' is lower alkyl, R" is H, alkyl, $CO_2$-alkyl, alkyl-$CO_2$-alkyl or alkyl-$CO_2$-($C_1$-$C_3$ alkyl-O)$_n$-alkyl (n=1-3), provided further that the dye is compatible with the novolac resin/quinone diazide formulation at a concentration of at least about 0.1 phr. Preferably the photoresist also includes a nitro naphthol dye.

DETAILED DESCRIPTION OF CERTAIN PREFERRED EMBODIMENTS

The present invention is generally directed to positive photoresists of the soluble novolac resin/quinone diazide type discussed above and described in the above-referenced patents. Unless stated otherwise, amounts of photoresist ingredients will be expressed as parts per hundred resin (phr) based upon the weight of the novolac resin(s). The quinone diazide sensitizer, such as those described in U.S. Pat. Nos. 3,646,118, 3,130,048, 3,640,992 and 3,785,825, the teachings of which are each incorporated herein by reference, is typically present at between about 25 and about 60 phr.

It is generally the case that the novolac resin and quinone diazide are dissolved in an organic solvent. The solution is applied to a substrate, e.g., a partially manufactured semiconductor device, and the solvent evaporated away. Typically, the total weight of the solvent will be between about 1.5 and about 3 times the combined weight of the solids. Suitable solvents include, but are not limited to acetone; methyl ethyl ketone; cyclopentanone; cyclohexanone; isoamyl ketone; polyhydric alcohols and derivatives thereof, e.g., ethylene glycol, ethylene glycol monoacetate, diethylene glycol and monomethyl, monoethyl, monopropyl, monobutyl and monophenyl ethers of diethylene glycol monoacetate; cyclic ethers; and esters, e.g., methyl acetate, ethyl acetate and butyl acetate; propylene glycol monomethyl ether acetate; ethyl lactate; ethyl 3-ethoxy propionate; diacetone alcohol; glyme; and mixtures of such organic solvents.

In accordance with the present invention, the positive photoresist of the novolac resin/quinone diazide contains between about 0.1 and about 4 phr, preferably between about 1 and about 2 phr, of a dye having the general formula:

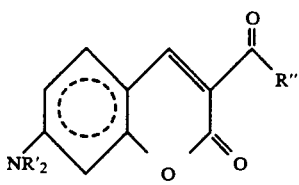

wherein R' is lower alkyl, R" is H, alkyl, $CO_2$-alkyl, alkyl-$CO_2$-alkyl or alkyl-$CO_2$-($C_1$-$C_3$ alkyl-O)$_n$-alkyl (n=1-3) and wherein said dye is compatible with the novolac resin/quinone diazide formulation to at least 0.1 phr. These dyes of the coumarin class have UV adsorption maxima in the 430-450 nm range. One preferred dye is 7-diethylamino-3-coumarinoylacetate or 2-H-1-Benzopyran-3-propanoic acid, 7-(diethylamino)-.beta., 2-dioxo-methyl ester:

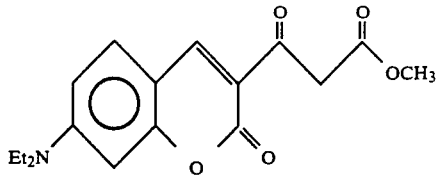

(JEO 1082-16), a synthesis of which is described in U.S. Pat. No. 4,147,552, the teachings of which are incorporated herein by reference. It is to be noted that a related coumarin, 7-diethylamino-5', 7'-dimethoxy-3,3'-carbonylbiscoumarin, is generally unsuitable for use in the present invention due to its effect of substantially reducing photospeed of the resist.

Another preferred related dye is 2-H-1-Benzopyran-3-propanoic acid, 7-(Dimethylamino)-.beta., 2-dioxo-, -2-(1-methoxypropyl) ester, which has the formula:

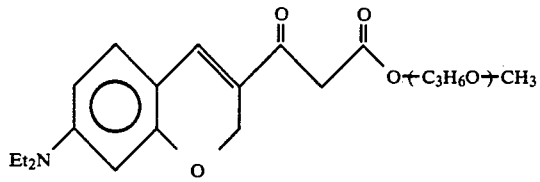

This dye exhibits excellent solubility in the solvents typically used in formulating the type of photoresists to which the present invention is directed. In particular, this dye is especially useful in systems using ethyl lactate as the solvent, which solvent is currently preferred in the newest positive photoresist formulations.

The coumarin dyes of the present invention may be used either alone or in conjunction with other dyes. Preferably, the coumarin dye of the present invention comprises at least about 15 wt. percent relative to the total amount of dye.

Common scanners frequently emit substantial levels of I-Line radiation, i.e., radiation in the region of 365 nm. This I-Line radiation tends to degrade sidewalls, and it is preferred that coumarin dyes, such as those of the general formula set forth above, be supplemented with an additional dye that strongly absorbs in the 365 nm region, if the photoresist is to be used with light sources which emit substantial levels of I-Line radiation. Preferred I-Line absorbing dyes are nitro naphthols, preferably nitro naphthols having at least two nitro groups. Also, salts, including ammonium, alkali and alkaline earth salts of nitro naphthols may be used. These dyes tend to have narrow absorption bands around the 365 nm band, are alkali-soluble, leaving no residue or scum after development, have good thermal stability and have good optical transparency in the G-Line range. A preferred dye is 2,4-dinitro, 1-naphthol. Another suitable nitro naphthol dye is 1,6-dinitro 2-naphthol.

If a nitro naphthol dye is used, the weight ratio of the coumarin dye to the nitro naphthol dye is generally between about 5:1 and about 1:5. Levels of the nitro naphthol dye are between about 0.1 and about 4 phr, preferably between about 1 and about 2 phr. Most preferably, the relative amounts of the coumarin dye and the nitro naphthol dye are adjusted so that the absorption value of the coumarin dye at 436 nm is equal to the absorption value of the nitro naphthol dye at 365 nm.

The photoresist of the present invention may also contain additional components as is known in the art, such as flow control agents, striation control agents, auxiliary resins, plasticizers and stabilizers.

The photoresist is used in a conventional manner. In a typical procedure, a solution of the photoresist is applied to a substrate body, e.g., a partially formed semiconductor device. The solvent is evaporated away. Typically, the layer that is deposited is between about 2 and 3 microns thick, but this may vary, particularly if the substrate surface is topographical. The coated substrate is then exposed to patterned actinic radiation and developed in mild alkaline aqueous solution, e.g., solution containing about 2 wt. % tetramethyl ammonium hydroxide (TMAH). With the exposed portions removed by the development, the underlying substrate is acted upon, e.g., by etching away underlying material or plating material thereon. Subsequently, the remaining portions are stripped, e.g., with strong caustic or by plasma stripping.

The invention will now be described in greater detail by way of specific example.

EXAMPLE 1

Formulations were prepared as containing:

| Component | |
|---|---|
| Novolac resin 60/40 meta/para cresol | 18 wt. % |
| Solvent (Propylene Glycol Monomethyl Ether Acetate (PGMEA)) | 73 wt. % |
| Quinone diazide sensitizer | 6 wt. % |
| Additives, e.g., striation remover, speed enhancer, etc. | 3 wt. % |

To this basic formulation was added various amounts of either 2-H-1-Benzopyran-3-propanoic acid, 7-(diethylamino)-.beta., 2-dioxo-, methyl ester, described above, in accordance with the present invention, (Dye A) or a dye tried previously for this purpose, 4-ethoxy-4' diethylamino azobenzene (Dye B).

The resist composition were each spin coated on a track coater manufactured by Silicon Valley Group, California, by dispensing resist onto 4" diameter poly silicon wafers. The coated wafers were then softbaked on a track with hotplate a 110° C. ±2° C. for 60 seconds. The resist film was then measured with a Nonospec AFT thickness measuring tool. A uniform coating of 1.8±0.1 μm, of resist film was obtained with a spinning speed of 4,000 revolutions per minute.

The coated wafers were exposed through a reticle on a broadband Ultratech Ultrastep (1:1) Wafer Stepper fitted with a lens of N.A. 0.315 to provide actinic radiation. A 5"×3" reticle with line and space widths of varying sizes, including some as small as 0.75 μm, was used to provide a selective exposure pattern. Exposure times were varied in order to determine the photospeed, i.e., the minimum amount of exposure energy (intensity X time) in millijoules/cm² which will solubilize the exposed areas of the resist so that the resist in the exposed areas will be completely removed/cleared during development. This is reported as Eo mJ/cm².

The imaged wafers produced as described above were placed in wafer boats and processed on a developing track, (manufactured by Silicon Valley Group, California) by spraying from a nozzle EPD-80 developer at 19° C.±1° C. The process to develop these imaged wafers is a combination of several sprays and puddle cycles programmed on the developing track. The total time for spray was 16 seconds and 13.5 seconds for puddle. The wafers were rinsed in deionized water and dried by spinning on a chunk on the track.

The developed wafers were then post-baked on a hotplate on a track at 140° C. for 60 seconds to increase the adhesion and chemical resistance of the undissolved portion of the coatings.

The table below is a comparison of photospeeds with Dyes A and B at various concentrations; the concentrations of dyes in the table being expressed as weight percent relative to the constituents listed above.

TABLE

| % Dye | Photospeed, mJ/cm²* |
|---|---|
| COMPARISON OF PHOTOSPEEDS WITH DYE B* | |
| 0 | 160 |
| 1 | 220 |
| 2 | 240 |
| 3 | 600 |
| COMPARISON OF PHOTOSPEEDS WITH DYE A* | |
| 0 | 170 |
| 1 | 132 |
| 2 | 144 |

*EPD-85 Developer
*EPD-80 Developer

It can be seen that whereas Dye B significantly reduces photospeed; in this case, Dye A actually enhances photospeed.

With Dye B, the portions of the resist remaining after development exhibited substantial reentrant sidewall image profile (reflective notching); whereas Dye A produced much cleaner sidewalls without reflective notching.

EXAMPLE 2

Formulations were prepared as containing:

| Formulation I | |
|---|---|
| Component | |
| Novolac resin 60/40 meta/para cresol | 21 wt. % |
| Solvent (Propylene Glycol Monomethyl Ether Acetate (PGMEA)) | 71 wt. % |
| Quinone diazide sensitizer | 6 wt. % |
| 2-H-1-Benzopyran-3-propanoic acid, 7-(diethylamino)-.beta., 2-iioxo-methyl ester. | .28 wt. % |
| 2,4 dinitro 1-napathol | .33 wt. % |
| Additives, e.g., striation remover, speed enhancer, etc. | 1.49 wt. % |

Formulation II was identical except that it was formulated without 2,4 dinitro 1-naphthol.

The resist compositions were each spin coated on a track coater manufactured by Silicon Valley Group, California, by dispensing resist onto 4" diameter polysilicon wafers. The coated wafers were then softbaked on a track with hotplate at 100° C. for 60 seconds. The resist film was then measured with a Nonospec AFT thickness measuring tool. A uniform coating of 1.3 μm of resist film was obtained with a spinning speed of 4,000 revolutions per minute.

The coated wafers were exposed on a 0.42 N.A. stepper at 200ms to provide actinic radiation. A 5"×3" reticle with line and space widths of varying sizes, including some as mall as 0.75 μm, was used to provide a selective exposure pattern. Exposure times were varied in order to determine the photospeed, i.e., the minimum amount of exposure energy (intensity X time) in millijoules/cm² which will solubilize the exposed areas of the resist so that the resist in the exposed areas will be completely removed/cleared during development. This is reported as Eo mJ/cm².

The imaged wafers produced as described above were placed in wafer boats and processed on a developing track, (manufactured by Silicon Valley Group, California) by spraying from a nozzle EPD-85 developer at 19° C.±1° C. The process to develop these imaged wafers is a combination of two sprays and puddle cycles programmed on the developing track. The total time for spray was 16 seconds and 13.5 seconds for puddle. The wafers were rinsed in deionized water and dried by spinning on a chuck on the track.

The developed wafers were then post-baked on a hotplate on a track at 110° C. for 60 seconds to increase the adhesion and chemical resistance of the undissolved portion of the coatings.

Formula I, containing both dyes, had a wall angle of 89° and a critical dimension of 0.85 micron; Formula II had a wall angle of 85° and a critical dimension of 0.90 micron. Thus, the nitro naphthol further reduces reflective notching.

EXAMPLE 3 solubilities of Dye A and other coumarin dyes in propylene glycol monomethyl ether acetate (PGMEA), Novolac resin solutions and PGMEA/Novolac resin solutions were compared. The other coumarin dyes compared were Coumarin 6, Coumarin 7, Coumarin 99 and dimethoxy Coumarin 99 having the following formulas:

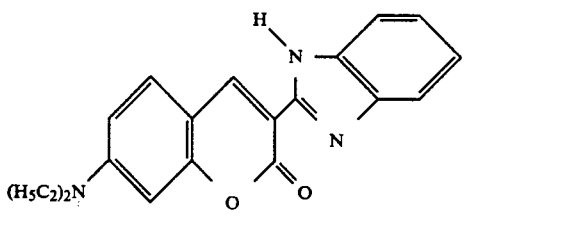

Coumarin 7

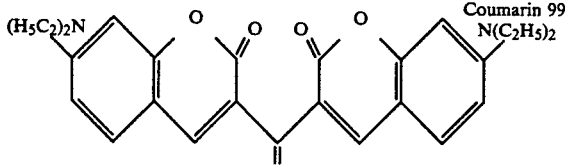

Coumarin 99

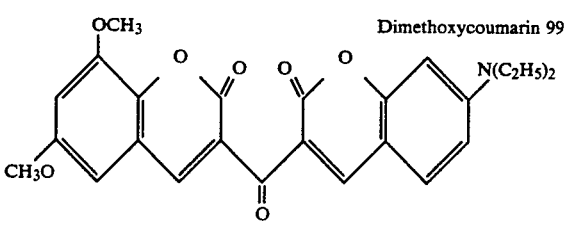

Dimethoxycoumarin 99

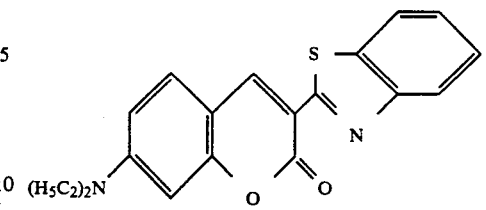

Coumarin 6

The Novolac resin solution was comprised of a novolac resin in PGMEA solvent at 0-30% by wt.

The dye and PGMEA and/or resin solution was added to a scinnalation vial. Each trial was run on a 10.0 gram sale. The dye was mixed with a sonicator for about 30 minutes until all the dye had dissolved. The vials were than stored at room temperature and compared the next day. The results are given below:

TABLE

| | % RESIN | | | | |
|---|---|---|---|---|---|
| | 30 | 10 | 10 | 0 | 0 |
| | | | % DYE | | |
| | 0.6 | 0.6 | 1.8 | 0.6 | 1.2 |
| Dye A | SOL | SOL | PRECIP | SOL | TRACE |
| Coumarin 6 | PRECIP | PRECIP | — | — | — |
| Coumarin 7 | SOL | PRECIP | — | SOL | PRECIP |
| Coumarin 99 | PRECIP | PRECIP | — | — | — |
| Dimethoxy-coumarin 99 | — | PRECIP | — | PRECIP | — |

SOL = No visible precipitate.
PRECIP = A visible precipitate was observed.
TRACE = Trace precipitate This study indicates that Dye A has superior solubility to several candidate Coumarin dyes. In Novolac solutions, the other Coumarin dyes have solubilities substantially below 0.6% while Dye A is soluble to about 1%. In straight PGMEA Dye A was soluble to about 1%, while the other Coumarin dyes were much less soluble.

EXAMPLE 4

SYNTHESIS OF 2-H-1-BENZOPYRAN-3-PROPANOIC ACID, 7-(DIMETHYLAMINO)-.BETA., 2-DIOXO-2-(1-METHOXYPROPYL) ESTER

This dye (Dye C) was synthesized from Dye A by replacing the methoxy group of the ester with a 1-methoxypropyl group.

| RAW MATERIALS | |
|---|---|
| 1. Dye A | 150 g |
| 2. PM (1-methoxy propanol) | 1125 g |
| 3. 98% sulfuric acid | 60 g |
| 4. Morpholine | 250 g |
| 5. D.I. Water | 3 Kg |

SET UP

The synthesis was run in a 2 L three-neck, round bottom flask equipped with a magnetic stirrer, Dean Stark trap, and external 80° C. hot water bath.

The quench step was run in a 5 L three-neck, round bottom flask equipped with a mechanical stirrer, addition funnel, thermometer and external crushed ice bath.

The filtration was run using a 200 mm Buchner funnel.

PROCEDURE

Dye A and PM were added to the 3 necked flask. The sulfuric acid was added slowly over a minute. The reaction mixture was heated to 80° C. with stirring. As the reaction proceeded the Dye A started dissolving until all the solids were in solution. After 3 hours at 80° C., the volatiles were stripped off the reaction using vacuum. After 6 hours at 80° C. the reaction was cooled to 50° C. and Morpholine was slowly added to neutralize the sulfuric acid. The PM/dye solution was then slowly added to 10° C. water (2 L) with vigorous stirring. The Dye C crystallized nicely as was filtered. The dye C was next washed 1 L of D.I. water. Finally, the Dye C was dried. The yield was 130 grams.

EXAMPLE 5

The composition of Example 1 was used to photospeeds of several dyes, including several coumarin dyes. Dyes A and C of the present invention are described above. Dye D is the Coumarin dye (not in accordance with this invention) 7-diethylamino-5', 7'-dimethoxy-3,3'-carbonylbiscoumarin described in referenced U.S. Pat. No. 4,147,552. In control sample C, no dye was used; in each of the other samples, the dye was used at 1% based on resist solids of 27%.

Table A below shows the effect of various dyes on the photospeed on aluminum and silicon. This photospeed is open frame visual gross clearing photospeed in $mJ/cm^2$.

Table B shows photospeed based upon equal lines and spaces of 0.8 microns. The photospeed based upon equal lines and spaces is a superior measure of photospeed to visual gross clearing.

Table C indicates notching on aluminum with 1.0 micron steps.

TABLE A

EFFECT OF VARIOUS DYES ON PHOTOSPEEDS IN EXAMPLE 1 RESIST

| SAMPLE | DYE | PHOTOSPEED, $mJ/cm^2$* | |
|---|---|---|---|
| | | SILICON | ALUMINUM |
| C | NONE | 89.75 | 79.80 |
| 1 | COUMARIN 6 | 199.20 | 224.07 |
| 2 | COUMARIN 7 | 199.20 | 229.05 |
| 3 | COUMARIN 314 | 131.38 | 139.50 |
| 4# | DYE D | 99.70 | 99.70 |
| 5 | DYE A | 109.65 | 129.55 |
| 6 | DYE C | 119.56 | 99.70 |

*Open frame visual gross clearing photospeed in $mJ/cm^2$.
Dye D was found to be only partially soluble in the resist at 1.0% level.
Resist coat: 1.50 microns
Soft bake: 110° C./60 seconds.
Exposure: GCA G line stepper (NA = 0.42)
Develop: Three puddle process at 19 C in EPD-82.5 developer.
Unexposed film loss; 0 in each case.

TABLE B

| RESIST REF. NO. | DYE | PHOTOSPEED 1:1 $mJ/cm^2$, 0.8 MICRONS | |
|---|---|---|---|
| | | SILICON | ALUMINUM |
| C | None | 103.96 | 85.99 |
| 1 | COUMARIN 6 | 253.72 | 234.74 |
| 2 | COUMARIN 7 | 217.78 | 222.75 |
| 3 | COUMARIN 314 | 199.81 | 192.80 |
| 4 | DYE D | 133.92 | 99.97 |

TABLE B-continued

| RESIST REF. NO. | DYE | PHOTOSPEED 1:1 $mJ/cm^2$, 0.8 MICRONS | |
|---|---|---|---|
| | | SILICON | ALUMINUM |
| 5 | DYE A | 145.89 | 132.90 |
| 6 | DYE C | 157.88 | 115.98 |

TABLE C

| RESIST | NOTCHING ON ALUMINUM WITH 1.0 MICRON STEPS |
|---|---|
| C | SEVERE |
| 1 | SEVERE |
| 2 | SEVERE |
| 3 | SEVERE |
| 4 | SEVERE |
| 5 | SLIGHT |
| 6 | SLIGHT |

It can be seen from Tables A–C that Dyes A and C gave superior performance in terms of photospeed and minimizing reflective notching relative to the other coumarin dyes.

EXAMPLE 6

A photoresist was formulated as follows:

| INGREDIENTS | WT. % |
|---|---|
| Primary Resin, 4382 Resin, a meta/para cresol Novolac Resin sold by Schenectady | 16.767 |
| Secondary Resin, Aceone Pyrogallol Resin (MP 160-170° C.) sold by Fuji | 5.160 |
| Sensitizer, 2,1,5 napthoquinone, chemically bound to resin | 6.040 |
| Solvent, ethyl lactate | 71.793 |
| (Fluoragard 430 (3M)) | 0.097 |

In sample 1, no dye was used. In sample 2, 0.139 wt. % of Sudan Orange G dye was used. In sample 3, 0.139 wt. % of Dye C of the present invention was used. In sample 4, 0.278 wt. % of Dye C was used. The developer used in each case was MF32.

Photospeeds and sidewall angles are shown in Table D below; reflective notching is described in Table E below. It can be seen that, particularly with respect to elimination of reflective notching, Dye C of the present invention is superior to the conventional dye, Sudan Orange G.

TABLE D

SUMMARY OF DATA

| RESIST MASK | PHOTOSPEED $mJ/cm^2$ | | SIDEWALL ANGLE SWA | |
|---|---|---|---|---|
| | 0.8* μ | 1.0* | 0.8* μ | 1.0* |
| 1 | 171 | 136 | 87.7° | 88.0° |
| 2 | 168 | 151 | 86.5° | 87.3° |
| 3 | 153.4 | 153.4 | 89.4° | 89.6° |
| 4 | 148.5 | 146 | 88.6° | 88.9° |

*Dimension

These resist formulations were compared for their performance after imaging on the GCA G line stepper. The developer used was MF 32.

TABLE E

| RESIST | SIDEWALL NOTCHING |
|---|---|
| 1 | SEVERE |
| 2 | SEVERE |

TABLE E-continued

| RESIST | SIDEWALL NOTCHING |
|---|---|
| 3 | SLIGHT |
| 4 | SLIGHT |

While the invention has been described in terms of certain preferred embodiments, modifications obvious to one with ordinary skill in the art may be made without departing from the scope of the present invention.

Various features of the invention are set forth in the following claims.

What is claimed is:

1. A positive acting photoresist comprising an admixture of an alkali-soluble novolac resin, between about 25 and about 60 phr of a quinone diazide photosensitizer, and between about 1 and about 4 phr of a dye of the formula:

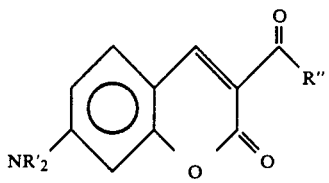

wherein R' is lower alkyl, R" is H, alkyl, $CO_2$-alkyl, alkyl-$CO_2$-alkyl or alkyl-$CO_2$-($C_1$-$C_3$ alkyl-O)$_n$-alkyl (n=1-3) and wherein said dye is compatible with the novolac resin and the quinone diazide to at least 1% phr.

2. A photoresist according to claim 1 wherein said dye is 2-H-1-Benzopyran-3-propanoic acid, 7-(diethylamino)-.beta., 2-dioxo-methyl ester.

3. A photoresist according to claim 1 wherein said dye is 2-H-1-Benzopyran-3-propanoic acid, 7-(diethylamino)-.beta., 2-dioxo-,-2-(1-methoxypropyl) ester.

4. A positive acting photoresist comprising an admixture of an alkali-soluble novolac resin, between about 25 and about 60 phr of a quinone diazide photosensitizer, and between about 1 and about 4 phr of a (first) dye of the formula:

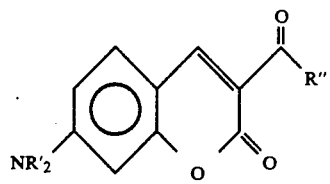

wherein R' is lower alkyl, R" is H, alkyl, $CO_2$-alkyl, alkyl-$CO_2$-alkyl or alkyl-$CO_2$-($C_1$-$C_3$ alkyl-O)$_n$-alkyl (n=1-3) and wherein said dye is compatible with the novolac resin and the quinone diazide to at least 1% phr, plus between about 1 and about 4 phr of a nitro naphthol (second) dye.

5. A photoresist according to claim 4 wherein said (first) dye is 2-H-1-Benzopyran-3-propanoic acid, 7-(diethylamino)-.beta., 2-dioxo-methyl ester.

6. A photoresist according to claim 4 wherein said (first) dye is 2-H-1-Benzopyran-3-propanoic acid, 7-(diethylamino)-.beta., 2-dioxo-,-2-(1-methoxypropyl) ester.

7. A photoresist according to claim 4 wherein said nitro naphthol dye is 2,4-dinitro 1-naphthol.

8. A photo resist according to claim 4 wherein said nitro naphthol dye is 1,6-dinitro 1-naphthol.

* * * * *